(12) United States Patent
Wang

(10) Patent No.: US 10,941,011 B2
(45) Date of Patent: Mar. 9, 2021

(54) EXPOSURE MACHINE AND METHOD OF TRANSFERRING A SUBSTRATE OF SAME

(71) Applicant: WUHAN CHINA STAR OPTOELECTRONICS TECHNOLOGY CO., LTD., Wuhan (CN)

(72) Inventor: Wei Wang, Wuhan (CN)

( * ) Notice: Subject to any disclaimer, the term of this patent is extended or adjusted under 35 U.S.C. 154(b) by 0 days.

(21) Appl. No.: 16/347,817

(22) PCT Filed: Apr. 15, 2019

(86) PCT No.: PCT/CN2019/082629
§ 371 (c)(1),
(2) Date: May 7, 2019

(87) PCT Pub. No.: WO2020/057114
PCT Pub. Date: Mar. 26, 2020

(65) Prior Publication Data
US 2020/0247631 A1  Aug. 6, 2020

(30) Foreign Application Priority Data
Sep. 19, 2018 (CN) .......................... 201811094615.X

(51) Int. Cl.
*B65H 5/08* (2006.01)
*H01L 21/677* (2006.01)

(52) U.S. Cl.
CPC ......... *B65H 5/08* (2013.01); *H01L 21/67754* (2013.01)

(58) Field of Classification Search
CPC combination set(s) only.
See application file for complete search history.

(56) References Cited

U.S. PATENT DOCUMENTS

2011/0141448 A1 * 6/2011 Aoki ................. H01L 21/67706
355/72
2011/0244396 A1  10/2011 Aoki et al.
2012/0064461 A1  3/2012 Aoki et al.

FOREIGN PATENT DOCUMENTS

| CN | 1978356 A | 6/2007 |
|---|---|---|
| CN | 102696099 A | 9/2012 |
| CN | 103119706 A | 5/2013 |
| CN | 103534787 A | 1/2014 |
| CN | 103534788 | * 1/2014 |
| CN | 103534788 A | 1/2014 |
| CN | 107315321 A | 11/2017 |
| CN | 107615769 A | 1/2018 |
| JP | H11233408 A | 8/1999 |
| JP | 2003092327 A | 3/2003 |
| JP | 2004273702 A | 9/2004 |
| JP | 2005298165 A | 10/2005 |

(Continued)

*Primary Examiner* — Minh Q Phan

(57) ABSTRACT

An exposure machine includes a base portion, a port portion, and a conveying structure. The base portion includes a work table and a bearing frame. The bearing frame is disposed on the work table and is configured to carry a tray. The port portion is configured to serve as a feed port and a discharge port of the exposure machine. The conveying structure includes at least one upper arm, at least one lower arm, and a movable tray guide. The movable tray guide is connected to the base portion and the port portion. The at least one lower arm is provided with a hook configured to hook the tray and move the tray to the port portion.

9 Claims, 2 Drawing Sheets

(56) References Cited

FOREIGN PATENT DOCUMENTS

| | | |
|---|---|---|
| JP | 2007035706 A | 2/2007 |
| JP | 2007316561 A | 12/2007 |
| JP | 2011176040 A | 9/2011 |
| JP | 2011228633 A | 11/2011 |
| JP | 2012076876 A | 4/2012 |
| JP | 5884267 B2 | 3/2016 |

\* cited by examiner

EXPOSURE MACHINE AND METHOD OF TRANSFERRING A SUBSTRATE OF SAME

FIELD OF INVENTION

The present disclosure relates to the field of display technologies, and more particularly to an exposure machine and a method of transferring a substrate of same.

BACKGROUND OF INVENTION

In recent years, small and medium-sized liquid crystal displays have developed rapidly. Low temperature polysilicon (LTPS) processes are applied to high-precision exposure machines. After a substrate is finished from an upstream coating process, a robot arm feeds the substrate into an exposure machine. In the prior art, two upper arms and two lower arms are designed in a port portion of the exposure machine, and the two upper arms and the two lower arms move the substrate between the port portion and a stage portion for transmission.

In summary, the exposure machine of the prior art loses a tact time due to a manner, in which the upper and lower arms are exchanged to pick up the substrate for transmission. Therefore, it is necessary to provide a new type of exposure machine and a method of transferring a substrate of same to improve a defect of the prior art.

SUMMARY OF INVENTION

An embodiment of the disclosure provides an exposure machine for solving a technical problem that a ticking time is lost due to a manner, in which upper and lower arms are exchanged to pick up the substrate for transmission.

To solve the above issues, a technical solution provided by the present disclosure is as follows.

An embodiment of the present disclosure provides an exposure machine including a base portion, a port portion, and a conveying structure. The base portion includes a work table and a bearing frame. The bearing frame is disposed on the work table configured to carry a tray, and the tray is configured to hold a substrate. The port portion is configured to serve as a feed port and a discharge port of the exposure machine. The conveying structure includes at least one upper arm, at least one lower arm, and a movable tray guide. The movable tray guide is connected to the base portion and the port portion. The at least one lower arm is provided with a hook configured to hook the tray and move the tray to the port portion.

In an embodiment of the present disclosure, the port portion includes a plurality of rollers and a plate loader.

In an embodiment of the present disclosure, the rollers are disposed on two sides of the plate loader and are configured to define a movement direction of the tray.

In an embodiment of the present disclosure, the plate loader is provided with a first set of thimbles configured to support the substrate and a second set of thimbles configured to support the tray.

In an embodiment of the present disclosure, a frame of the exposure machine is provided with a first track for an upper arm movement and a second track for a lower arm movement.

In an embodiment of the present disclosure, the movable tray guide includes an inclined plate, a fixed base, and a rotating shaft on the fixed base, and the inclined plate is mounted on the fixed base through the rotating shaft.

An embodiment of the present disclosure further provides a method of transferring a substrate of the above exposure machine. The method includes S101, taking a set of trays carrying the substrate from the port portion using the at least one upper arm and performing an exposure to the trays when the trays are placed on the bearing frame disposed on the work table, S102, after the exposure is completed, the movable tray guide rotates, such that the base portion and the port portion are in a same plane, and S103, hooking the trays with the hook and pulling the trays to the port portion to complete a transfer.

In an embodiment of the present disclosure, when an exposure process is performed in S101, the at least one lower arm is disposed on two sides of the port portion.

In an embodiment of the present disclosure, the at least one lower arm moves to the base portion when the movable tray guide rotates in S102.

In an embodiment of the present disclosure, when the hook hooks and moves the trays in S103, the at least one upper arm grips a next set of substrates onto the bearing frame to perform the exposure process.

Beneficial effects of the embodiment of present disclosure are that, the embodiment of the present disclosure provides an exposure machine and a method of transferring a substrate of same, the tray is directly pulled from the base portion to the port portion by hooking the tray on the lower arm using the hook, and then is conveyed outside of the exposure machine. In addition, the upper arm clamps the next set of substrates for the exposure process, which reduces a loss of a tact time caused by exchange of the upper and lower arms in the exposure machine and improves production efficiency.

DESCRIPTION OF DRAWINGS

The accompanying figures to be used in the description of embodiments of the present disclosure or the prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
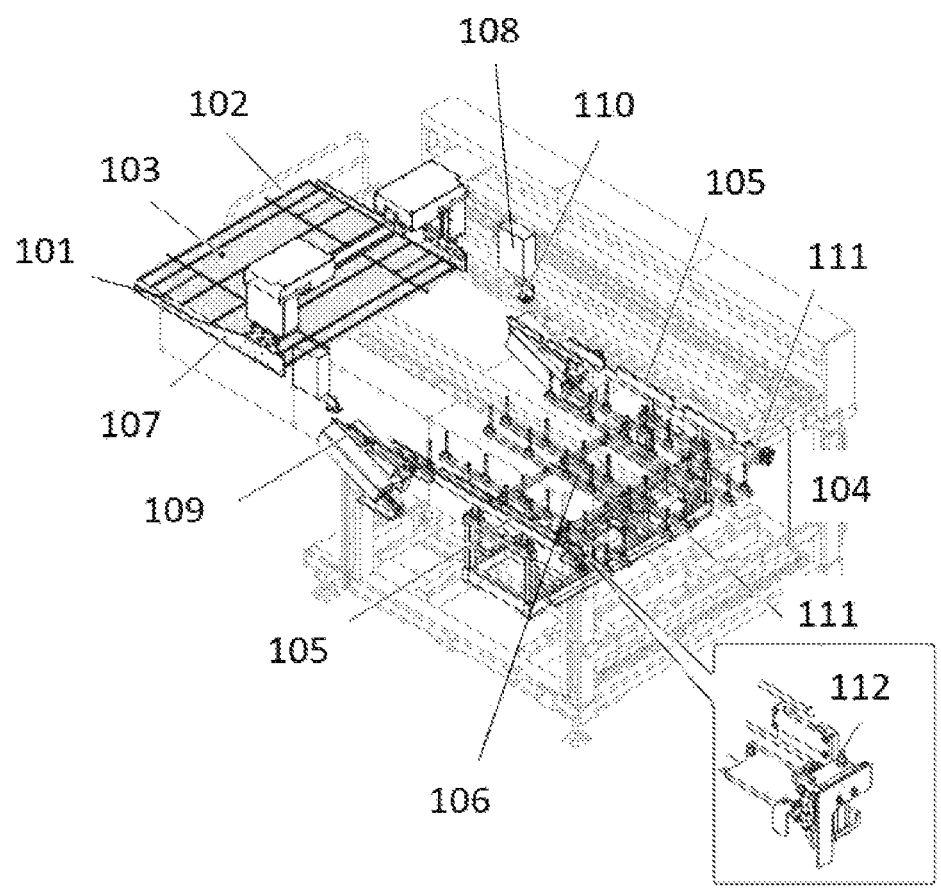
FIG. 1 is a schematic structural diagram of an exposure machine according to an embodiment of the present disclosure.

The following description of the various embodiments is provided to illustrate the specific embodiments with reference to the accompanying drawings. Directional terms described by the present disclosure, such as top, bottom, front, back, left, right, inner, outer, side, etc., are only directions by referring to the accompanying drawings. Therefore, the directional terms used are for the purpose of illustration and understanding of the present disclosure and are not intended to be limiting of the present disclosure. In the drawings, units with similar structures are labeled with the same reference number.

In an exposure machine of the prior art, a tact time is lost due to a manner, in which lower arms clamps a substrate and conveys the substrate outside of the exposure machine. The embodiment can solve the defect.

As illustrated in FIG. 1, a basic structural diagram of an exposure machine is provided by an embodiment. Components of the embodiment of the present disclosure and relative positional relationship between the components can be visually seen from the figure. The exposure machine is composed of a base portion 101, a port portion 104, and a conveying structure. The base portion 101 at least includes a work table and a bearing frame. The bearing frame is disposed on the work table. A tray 102 is placed on the bearing frame. The tray 102 is a plastic blister, which is a plastic material that is made into a specific groove by a plastic process. A substrate 103 is placed in the specific groove to serve to protect the substrate 103. The port portion 104 is configured to serve as a feed port and a discharge port of the exposure machine. The conveying structure includes at least one upper arm 107, at least one lower arm 108, and a movable tray guide 109. The movable tray guide 109 is disposed between the base portion 101 and the port portion 104 and is rotatable. The movable tray guide 109 is connected to the base portion 101 and the port portion 104. The at least one lower arm 108 is provided with a hook 110 configured to hook the tray 102 and move the tray 102 to the port portion 104. The hook 110 is sized to hook the tray 102.

In this embodiment, the port portion 104 includes a plurality of rollers 105 and a plate loader 106, and the roller 105 are disposed on left and right sides of the plate loader 106 configured to define a movement direction of the tray 102. The plate loader 106 is provided with a first set of thimbles 111 configured to support the substrate 103 and a second set of thimbles 112 configured to support the tray 102. The second set of thimbles 112 includes four positioning members.

In this embodiment, a frame of the exposure machine is provided with a first track for an upper arm movement and a second track for a lower arm movement. The movable tray guide 109 is composed of two symmetrical parts. Any one of the symmetrical parts includes an inclined plate, a fixed base, and a rotating shaft on the fixed base. The inclined plate is mounted on the fixed base through the rotating shaft. The rotating shaft may be a horizontal rotating shaft or a vertical rotating shaft. The inclined plate can be rotated relative to the fixed base, such that the base portion and the plate loader are in a same plane. The tray 102 can be directly slid from the base portion 101 to the port portion 104 through the movable tray guide 109. The rollers 105 disposed on the left and right sides of the port portion 104 can be used not only for guiding the movement of the tray 102 but also for fixing the movable tray guide 109.

Figure 2:
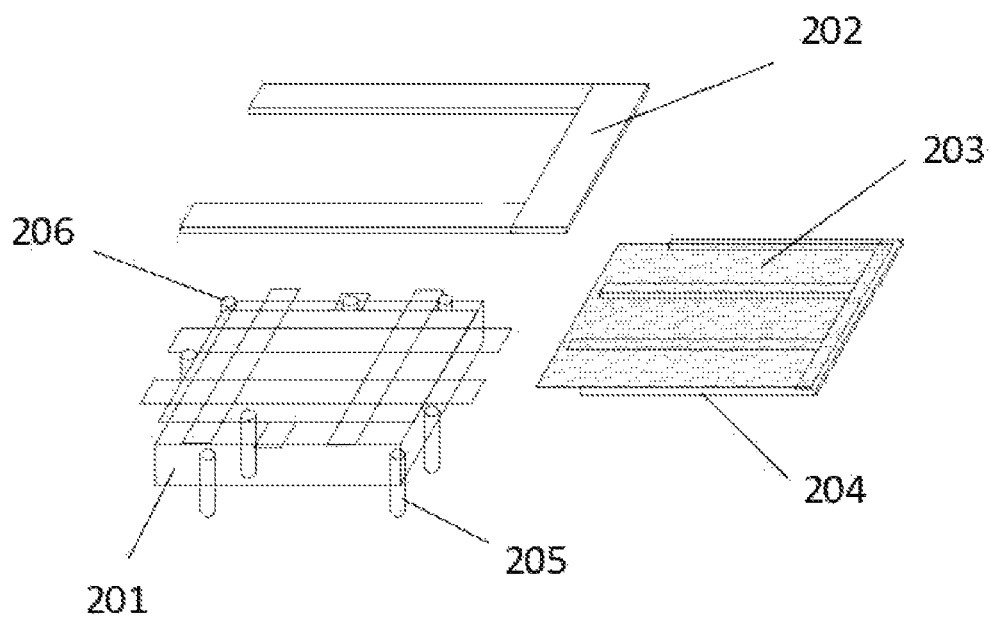
FIG. 2 is a partial structural diagram of a current exposure machine for transferring a substrate.

As illustrated in FIG. 2, a partial structural diagram of a current exposure machine for transferring a substrate is provided. After a substrate 203 is finished from an upstream coating process, a robot arm (input/output arm) 204 feeds the substrate 203 into the exposure machine. An upper arm 202 takes a tray carrying the substrate 203 from a port portion 201 and an exposure to the tray is performed when the tray is placed on a bearing frame disposed on a work table. The port portion 201 is provided with a first set of thimbles 206 configured to support the substrate 203 and a second set of thimbles 205 configured to support the tray.

Figure 3:
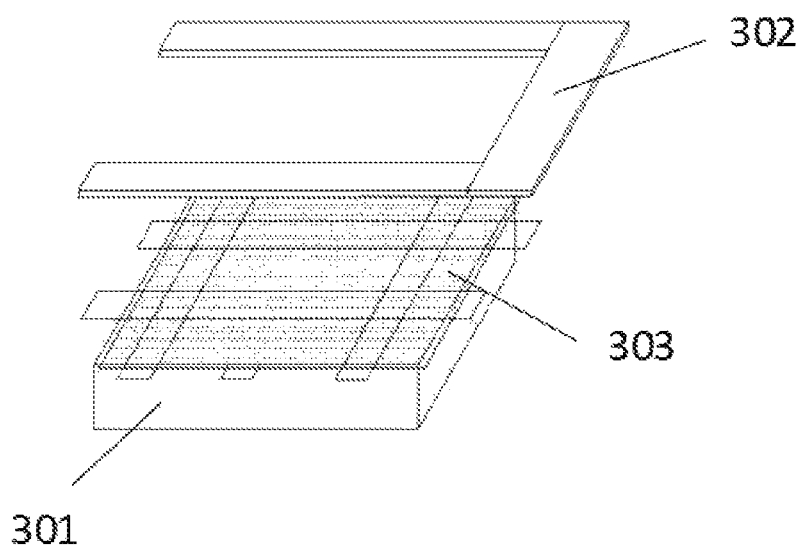
FIG. 3 is another partial structural diagram of a current exposure machine for transferring a substrate.

Correspondingly, referring to FIG. 3, another partial structural diagram of a current exposure machine for transferring a substrate is provided. After the exposure process is completed, a lower arm 302 takes out a tray carrying a substrate 303 from a bearing frame 301 and transports the tray to the port portion. In the process, because upper and lower arms are exchanged, and the substrate is sent to outside of the exposure machine, a tact time is lost. Therefore, it is necessary to provide a new method for improving a tact time of an exposure mechanism to improve the defect.

With reference to FIG. 1, a method for transmitting a substrate using the exposure machine of FIG. 1 according to an embodiment of the present disclosure includes following steps of S101, taking a set of trays 102 carrying the substrate 103 from the port portion 104 using the at least one upper arm 107 and performing an exposure to the trays 102 when the trays 102 are placed on the bearing frame disposed on the work table, S102, after the exposure is completed, the inclined plate of the movable tray guide 109 rotates, such that the base portion 101 and the plate loader 106 are in a same plane, and S103, hooking the trays 102 with the hook 110 and pulling the trays 102 to the port portion 104 using the at least one lower arm 108 to complete a transfer.

When an exposure process is performed in S101, the at least one lower arm is disposed on two sides of the port portion. The at least one lower arm moves to the base portion when the movable tray guide rotates in S102. When the hook hooks and moves the trays in S103, the at least one upper arm grips a next set of substrates onto the bearing frame to perform the exposure process.

In summary, the embodiment of the present disclosure provides an exposure machine and a method of transferring a substrate of same, the tray is directly pulled from the base portion to the port portion by hooking the tray on the lower arm using the hook, and then is conveyed outside of the exposure machine. In addition, the upper arm clamps the next set of substrates for the exposure process, which reduces a loss of a tact time caused by exchange of the upper and lower arms in the exposure machine and improves production efficiency.

An exposure machine and a method of transferring a substrate of same according to embodiments of the present disclosure are described in detail above. It is understood that the exemplary embodiments described herein are to be considered as illustrative only, are provided to aid in understanding the method of the present disclosure and its core concepts, and are not intended to limit the present disclosure.

What is claimed is:

1. An exposure machine, comprising:
    a base portion comprising a work table and a bearing frame, wherein the bearing frame is disposed on the work table configured to carry a tray, and the tray is configured to hold a substrate;
    a port portion configured to serve as a feed port and a discharge port of the exposure machine; and
    a conveying structure comprising at least one upper arm, at least one lower arm, and a movable tray guide, wherein the movable tray guide is connected to the base portion and the port portion;
    wherein the at least one lower arm is provided with a hook configured to hook the tray and move the tray to the port portion;
    wherein the movable tray guide comprises an inclined plate, a fixed base, and a rotating shaft on the fixed base, and the inclined plate is mounted on the fixed base through the rotating shaft.

2. The exposure machine according to claim 1, wherein the port portion comprises a plurality of rollers and a plate loader.

3. The exposure machine according to claim 2, wherein the rollers are disposed on two sides of the plate loader and are configured to define a movement direction of the tray.

4. The exposure machine according to claim 3, wherein the plate loader is provided with a first set of thimbles configured to support the substrate and a second set of thimbles configured to support the tray.

5. The exposure machine according to claim 1, wherein a frame of the exposure machine is provided with a first track for an upper arm movement and a second track for a lower arm movement.

6. A method of transferring a substrate of the exposure machine according to claim 1, the method comprising:
- S101, taking a set of trays carrying the substrate from the port portion using the at least one upper arm and performing an exposure to the trays when the trays are placed on the bearing frame disposed on the work table;
- S102, after the exposure is completed, the movable tray guide rotates, such that the base portion and the port portion are in a same plane; and
- S103, hooking the trays with the hook and pulling the trays to the port portion to complete a transfer.

7. The method according to claim 6, wherein when an exposure process is performed in S101, the at least one lower arm is disposed on two sides of the port portion.

8. The method according to claim 6, wherein the at least one lower arm moves to the base portion when the movable tray guide rotates in S102.

9. The method according to claim 6, when the hook hooks and moves the trays in S103, the at least one upper arm grips a next set of substrates onto the bearing frame to perform the exposure process.

* * * * *